United States Patent
Vosters et al.

(10) Patent No.: US 6,970,230 B2
(45) Date of Patent: Nov. 29, 2005

(54) LITHOGRAPHIC APPARATUS AND DEVICE MANUFACTURING METHOD

(75) Inventors: Petrus Matthijs Henricus Vosters, Bladel (NL); Hernes Jacobs, Eindhoven (NL); Harmen Klaas Van Der Schoot, Vught (NL); Peter Rutgers, Hengelo (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/458,727

(22) Filed: Jun. 11, 2003

(65) Prior Publication Data

US 2004/0061844 A1 Apr. 1, 2004

(30) Foreign Application Priority Data

Jun. 13, 2002 (EP) .............................................. 02254139

(51) Int. Cl.[7] .................. G03B 27/42; G03B 27/58; F16J 15/16
(52) U.S. Cl. ............................. 355/53; 355/72; 277/345
(58) Field of Search ............................. 355/72, 53, 30; 108/94; 250/492.2; 118/719; 414/225; 277/345

(56) References Cited

U.S. PATENT DOCUMENTS

| 3,641,973 A | * | 2/1972 | Shrader ........................ 118/719 |
| 4,430,571 A | * | 2/1984 | Smith et al. .............. 250/492.2 |
| 5,380,246 A | | 1/1995 | Katahira |
| 6,279,490 B1 | * | 8/2001 | Pastor ........................... 108/94 |
| 6,445,440 B1 | | 9/2002 | Bisschops et al. |
| 2002/0079464 A1 | | 6/2002 | Driessen et al. |

FOREIGN PATENT DOCUMENTS

| EP | 1 052 553 A2 | 11/2000 |
| JP | 58-044719 | 3/1983 |
| JP | 2001-085291 | 3/2001 |

* cited by examiner

Primary Examiner—Peter B. Kim
(74) Attorney, Agent, or Firm—Pillsbury Winthrop Shaw Pittman LLP

(57) ABSTRACT

A linear seal seals over a slot formed in a wall of a vacuum chamber of a lithographic projection apparatus. The linear seal includes an elongate sealing member which is locally displaced from the slot at a selectable position such that conduits may pass from outside of the vacuum chamber to the inside of the vacuum chamber at the local displacement of the elongate sealing member.

12 Claims, 4 Drawing Sheets

LITHOGRAPHIC APPARATUS AND DEVICE MANUFACTURING METHOD

This application claims priority to European Patent Application 02254139.5, filed Jun. 13, 2002, the entire contents of which are incorporated herein by reference.

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam of radiation in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic apparatus, the size of features that can be imaged onto the substrate is limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser produced plasma sources and discharge plasma sources.

Other proposed radiation types include electron beams and ion beams. Further information with regard to the use of electron beams in lithography can be gleaned, for example, from U.S. Pat. Nos. 5,079,122 and 5,260,151, as well as from U.S. Pat. No. 6,429,440. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for charged particle beams. Otherwise, for apparatus using EUV radiation, the total vacuum pressure need only be between $10^{-5}$ and $10^{-7}$ millibar $H_2O$ and between $10^{-7}$ and $10^{-9}$ millibar $C_xH_y$. Optical elements for EUV radiation can be spoiled by the deposition of carbon layers on their surface, which imposes the additional requirement that hydrocarbon partial pressures should generally be kept as low as possible, for example below $10^{-8}$ or $10^{-9}$ millibar.

Working in a high vacuum imposes quite onerous conditions on the components that must be put into the vacuum. For components inside the vacuum chamber, materials that minimize or eliminate contaminant and total outgassing, i.e. both outgassing from the materials themselves and from gases adsorbed on their surfaces, should be used. Conventional designs of substrate, mask and transfer stages are very complicated and employ large numbers of sensors and drive arrangements, which all need a large numbers of conduits for conveying water and gases and for protecting electric wiring.

A solution proposed in U.S. Pat. No. 6,618,122 includes conduits that are fed through hollow pipes that are rigidly connected to a movable object table. The pipes are used to transfer movements from outside a vacuum chamber to the table. The pipes are hollow and the pressure within the pipes is equal to the pressure outside the vacuum chamber. The pipes pass through an elongate slot in a wall of the vacuum chamber and are movable in the elongate direction of that slot. A seal is maintained over that slot by a sliding seal plate through which the pipe extends and which is also displaceable in the elongate direction of the slot. Thus, many components can be left outside of the vacuum. A problem with this arrangement is the high inertia of the sliding seal plate as well as the need for air bearings around the outside of the plate to minimize friction and resulting wear from movement of the sliding seal plate against the vacuum chamber wall. The air bearings increase the complexity, bulk and weight of the assembly.

SUMMARY OF THE INVENTION

It is an aspect of the present invention to provide a lithographic projection apparatus in which problems caused by high inertia, large size and complexity of linear moving seals are avoided or alleviated.

This and other aspects are achieved according to the invention in a lithographic apparatus including a radiation system constructed and arranged to supply a beam of radiation; a support constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; a vacuum chamber that encloses at least one of the support and the substrate table; an elongate through-slot in a wall of the vacuum chamber; and a linear seal constructed and arranged to seal the vacuum chamber along the slot, wherein the linear seal comprises an elongate sealing member constructed and arranged to seal the vacuum chamber along the slot, the sealing member being locally displacable at a selectable position to provide an opening into the vacuum chamber.

In this way no relative sliding displacement between the elongate sealing member and the wall of the vacuum chamber is present during movement of the selectable position along the slot and thus the need for air bearings is avoided. In fact, as the selectable position moves along the slot the elongate sealing member can be arranged to simply lift off the slot (or to one side). In the case of the sealing member lifting to one side, any friction between the elongate sealing member and the vacuum chamber wall is confined to the local selectable position rather than to the whole of the elongate sealing member. Furthermore, the energy required to move the selectable position along the slot is low as only a small part of the elongate sealing member needs to be moved, namely the material of the elongate sealing member at the selectable position.

Preferably a conduit constructed and arranged to provide utilities to at least one of the support structure and the substrate table in the vacuum chamber passes through the slot at the selectable position.

The term "utilities" as here employed refers to the fluids (e.g. water, gas) electricity and signals that must be provided to the moveable component (i.e. support structure or substrate table). The term conduit refers to the cables and tubes that are used to transport the utilities to the moveable component. By way of example, such conduits may include power cords, signal carriers, gas hoses (e.g. to supply gas to a gas bearing in the table), coolant hoses, etc. Moveable components inside the vacuum chamber including at least one of the mask table and the substrate table and associated motors and sensors may be connected to a frame outside the vacuum chamber in this manner (using a distinct conduit for each component).

If the moveable component is moveable in two dimensions then, as the selectable position has one degree of freedom, the conduit itself only requires one degree of freedom, namely in the direction substantially normal to the elongate direction of the slot to accommodate movement of the moveable component.

Preferably the elongate sealing member is comprised of a metallic material. In this way, out-gassing of the elongate sealing member may be minimized.

According to another aspect of the present invention, there is provided a lithographic projection apparatus including a radiation system constructed and arranged to provide a beam of radiation; a support structure constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; a vacuum chamber that encloses at least one of the support structure and the substrate table; an elongate through-slot in a wall of the vacuum chamber; and a linear seal constructed and arranged to seal the vacuum chamber along the slot, wherein the linear seal comprises a rotatable sealing band sealing against the slot.

According to a further aspect of the present invention there is provided a device manufacturing method including providing a beam of radiation; patterning the beam of radiation with a pattern in its cross-section; projecting the patterned beam of radiation onto a target portion of a layer of radiation-sensitive material provided on a substrate; providing a vacuum chamber around at least one of a substrate and the patterning device that patterns the beam in its cross section; providing an elongate through-slot in a wall of the vacuum chamber; positioning the substrate or the patterning device in the vacuum chamber; sealing the vacuum chamber along the through-slot using a linear seal, wherein the linear seal comprises an elongate sealing member for sealing the vacuum chamber along the through-slot; and locally displacing the elongate sealing member at a selectable position to provide an opening into the vacuum chamber.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
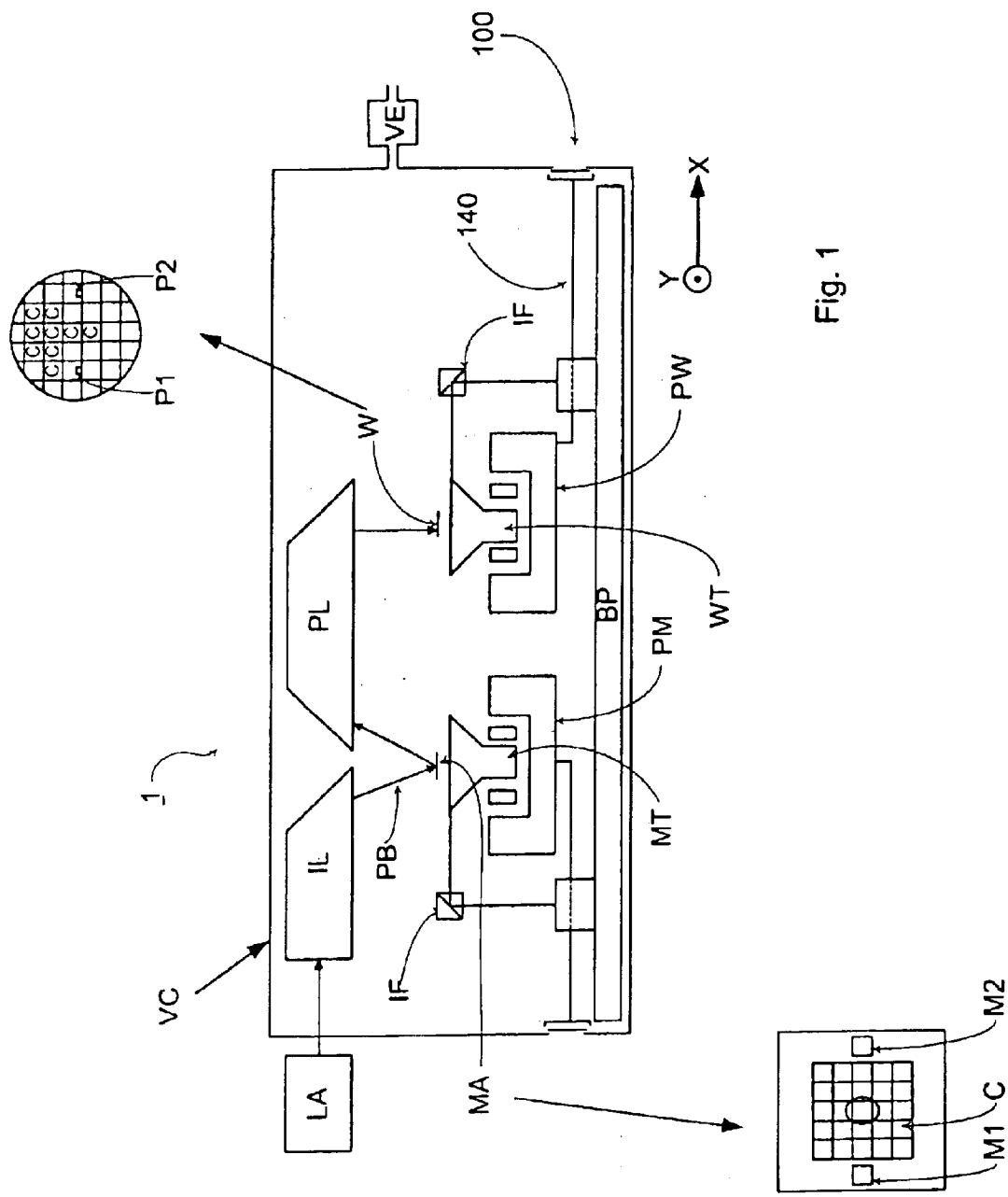
FIG. 1 depicts a lithographic projection apparatus according to an embodiment of the present invention.

FIG. 1 schematically depicts a lithographic projection apparatus 1 according to an embodiment of the present invention. The apparatus 1 includes a base plate BP; a radiation system Ex, IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

In a lithographic projection apparatus according to the present invention, at least one of the first object table MT (support structure constructed and arranged to support the patterning device or mask) and the second object table WT (the substrate table) are provided in a vacuum chamber VC. The vacuum inside the vacuum chamber VC is created with a vacuum generator VE, for example a pump.

Equipment associated with an object table may include alignment sensors, air bearings with differential vacuum seals, positioning motors and actuators which require utilities such as power, control signals, vacuum and gases and supply utilities such as measurement signals and further control signals. These utilities are supplied by conduits 140 such as hoses, pipes, electric cables etc. which pass into the vacuum chamber VC through an opening in a linear seal 100 in a wall 110 of the vacuum chamber VC. Although the linear seal 100 of the present invention is described in relation to a single substrate table WT or mask table MT, the invention is equally applicable to a so called dual or multi stage lithographic projection apparatus which has two or multiple substrate tables each with a substrate holder for holding a substrate W and each connected to a positioning device constructed and arranged to position the substrate W. In this case each substrate table would have an associated linear seal. The substrate table(s) is(are) positioned on the base plate BP.

The first and second object tables MT, WT are often required to move in two degrees of freedom. Thus, the utilities which are provided from outside of the vacuum chamber VC to the object tables MT, WT must be provided through conduits 140 with the same number of degrees of freedom. In the present invention this is achieved by providing the conduits 140 inside the vacuum chamber VC with one degree of freedom and by allowing the end of the conduits 140 a second degree of freedom as they pass through the wall 110 of the vacuum chamber. This second degree of freedom is provided by linear seal 100.

Figure 2:
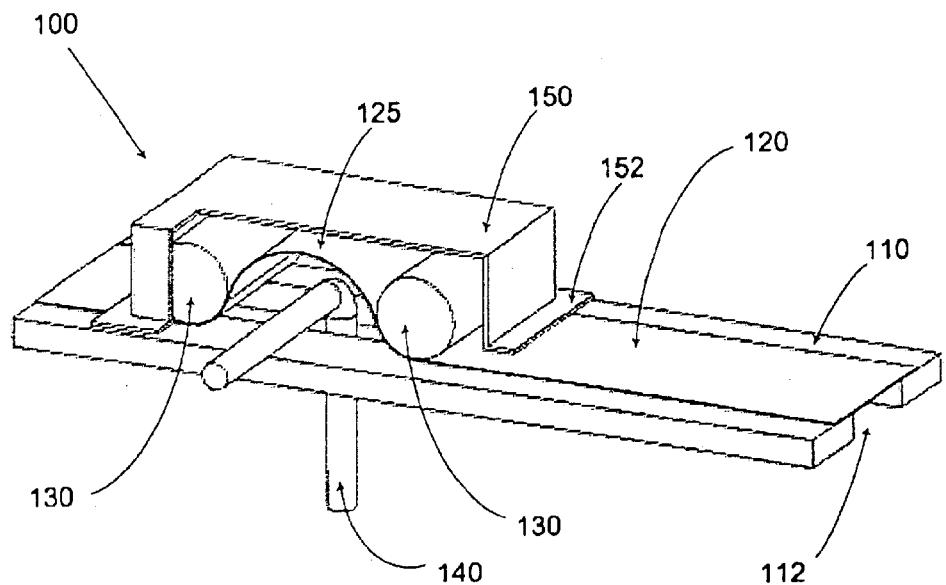
FIG. 2 depicts a perspective view of a linear seal according to the present invention in which the housing is cut away to reveal internal components.

The linear seal 100 of the present invention is illustrated in FIG. 2. The linear seal 100 seals over an elongate slot 112 in a wall 110 of the vacuum chamber VC. The linear seal 100 includes a elongate sealing member 120 which is positioned over the elongate slot 112 in the wall 110 of the vacuum chamber VC. The elongate sealing member 120 is locally displaced away from the slot 112 at a selectable position 125 to form the opening into the vacuum chamber from outside.

If the elongate sealing member 120 is formed of a flexible material (for example a thin sheet of metal), it can be locally displaced at the selectable position 125 by bending in an inverted U shape. The preferred material of the elongate sealing member 120 is a metal, preferably one which has ferromagnetic properties, for example, stainless steel about 0.1 mm thick. Such a material has the advantage over rubber or a plastics material in that it does not outgas. The position 125 at which the elongate sealing member 120 is bent in an inverted U shape away from the slot 112 in a direction substantially orthogonal to the surface of the wall 110 is selectable. The portion locally displaced from the slot 112 can be changed by movement of the bent portion along the elongate sealing member 120. It will be appreciated that the bent portion "moves" in the same way as a transverse wave in a taut string by lateral rather than longitudinal movement of parts of the sealing member. Conduits 140 may pass through the opening in the linear seal 100 at the selectable position 125 at which the elongate slot 112 is not sealed by the elongate member 120. Thus the conduits 140 may pass from outside of the vacuum chamber VC (below the linear seal 100 as illustrated in FIG. 2) to inside of the vacuum chamber VC (above the linear seal as illustrated). In this way the end of the conduits 140 are provided with one degree of freedom in the vacuum chamber VC.

In the illustrated embodiment, the elongate sealing member 120 bends at the selected position 125 in a direction orthogonal to the plane of the vacuum chamber wall 110. In fact, if an elongate sealing member 120 with a square (rather than rectangular) cross section perpendicular to the elongate direction and made of a very compliant material is used, the bend of the selectable portion may be displaced from the slot 112 in a direction substantially parallel to the plane of the vacuum chamber wall 110.

In the preferred embodiment rollers 130 are provided on either side of the selectable position 125 to bend the elongate sealing member 120 locally away from the slot 112 to form the opening such that the conduit 140 may enter the vacuum chamber VC through the slot under the bend (i.e. the opening). Other ways of bending the elongate sealing member 120 are also possible but the advantage of rollers 130, which are in rolling contact with the elongate sealing member 120, is that friction when the assembly moves to select a different position 125 is reduced.

A frame member (not illustrated) attached between the conduit 140 and the rollers 130 may be conveniently used to transfer a force applied to the conduit outside of the vacuum chamber VC, to the rollers 130. In this way the reaction force (upwards as illustrated) of the elongate sealing member 120 due to it being bent is countered by the rollers 130 which can have a (downwards as illustrated) force applied to them by the conduit 140. Thus the bend in the elongate sealing member 120 may be contained between the rollers 130 and the remainder of the sealing member 120 can be maintained flat. Selection of the position 125 at which the elongate sealing member 120 is locally displaced from the slot 112 is then made possible by actuation of the conduit 140 along the elongate direction of the slot 112. Magnets (not illustrated) may be provided along the edge of the slot 112 in the vacuum chamber VC wall 110 to attract the elongate sealing member 120 (if made of a ferromagnetic material) along sealing portions to form a better seal.

In the embodiment illustrated in FIG. 2, the vacuum chamber VC is at about $10^{-7}$ millibar $H_2O$ provided above the elongate sealing member as illustrated and a lower vacuum of about $10^{-3}$ millibar is provided underneath the elongate sealing member 120 as illustrated. A vacuum must be provided on each side of the sealing member such that the force of the low vacuum on the sealing member 120 does not push the sealing member 120 away from the vacuum chamber wall 110 into the vacuum chamber VC and to avoid severe leakage into the high vacuum through the seal. If the high vacuum is positioned underneath the elongate sealing member 120 as illustrated in FIG. 2, the requirement for vacuum on the other side of the elongate sealing member 120 is no longer present as the higher pressure outside of the vacuum chamber VC will act only to push the elongate sealing member 120 against the wall 110 to create a better seal.

The linear seal includes a further sealing member which may also be attached to the frame member, which seals the vacuum chamber around the slot 112 at the selected position 125. In the illustrated embodiment this is provided by a housing 150 which is placed over the rollers 130 and through which the conduit 140 extends. A bottom flange 152 of the housing is positioned close to the elongate sealing member 120 and the wall 110 of the vacuum chamber VC to provide a seal. The separation of the housing 150 from the elongate sealing member 120 and the wall 110 is less than 0.1 mm. Either the flange 152 of the housing 150 includes a recess in which the elongate sealing member 120 is positionable or the sealing member 120 is recessed into the wall of the vacuum chamber 110 by provision of a recess in the wall 110 at the edge of the elongate slot 112. If required, air bearings may be provided around the flange 152.

Although the further sealing member is described as a housing 150, it is also possible that the further sealing member is positioned on the other side of the elongate sealing member 120 and comprises either a housing or a member which extends underneath the bend in the selectable position 125. In that case close positioning to the sealing member 120 in its local position at the opening where it is bent at the selectable position 125 and the edges of the slot 112 is required.

Figure 3:
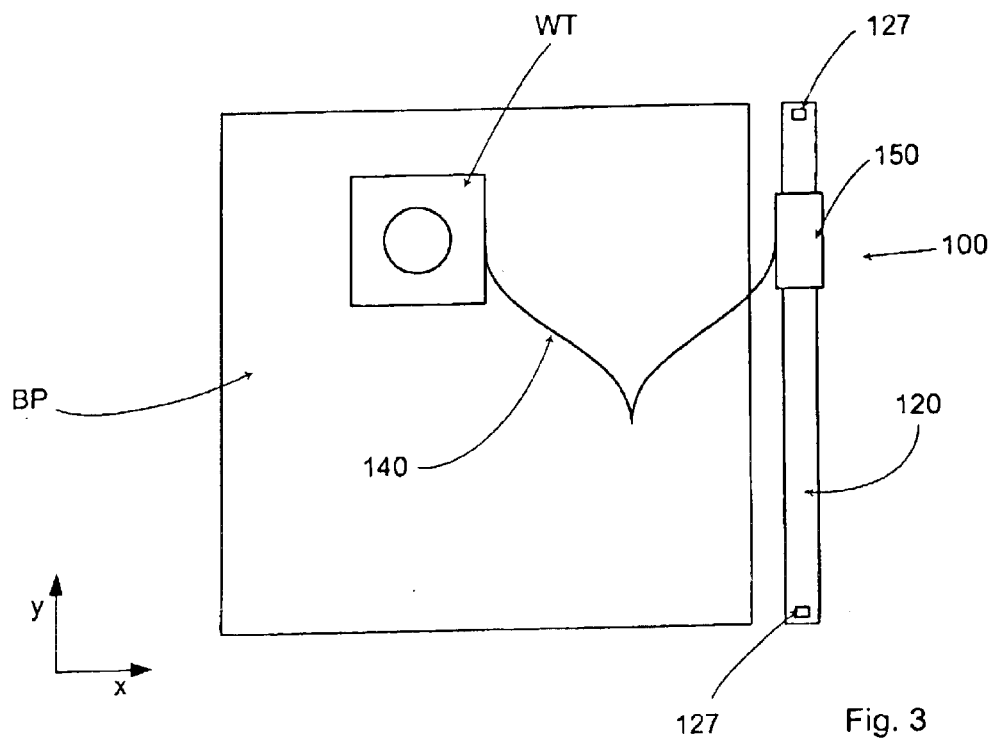
FIG. 3 depicts a plan view of a wafer stage and linear seal according to the present invention.

FIG. 3 illustrates how the linear seal 100 is used in conjunction with a substrate table WT. The substrate table WT can move in two dimensions on the base plate BP. The conduits 140 extend between the housing 150 of the linear seal 100 and the substrate table WT. When the substrate table WT moves in the Y direction, a corresponding movement in the Y direction of the housing 150 and thereby movement of the conduit end occurs. On movement in the Y direction the rollers 130 move in the elongate direction of the elongate slot 112 thereby selecting the position 125 at which the elongate sealing member is locally displaced from the slot 112. When the substrate table WT moves in the X direction the conduits 140 take up that movement by bending. Of course the conduits are illustrated as flexible in FIG. 3 though this may not be the case and the conduits may be rigid and movement of the substrate table WT in the X direction may be taken up by a mechanical mechanism. For an example of such an arrangement see U.S. Pat. No. 6,618,122.

FIG. 3 also illustrates that the elongate sealing member 120 is fixed in close proximity to each end or fixation point 127. As will be appreciated, the elongate sealing member 120 is longer than the slot 112 and so the distance apart of the fixation points 127 of the elongate member 120 is less than the length of the elongate member 120. This allows the elongate member 120 to bend at the selectable position 125.

Although the elongate sealing member 120 and housing 150 have been illustrated as being positioned in the vacuum chamber VC, it is possible for those elements or even only one of those elements to be situated outside of the vacuum chamber.

Figure 4:
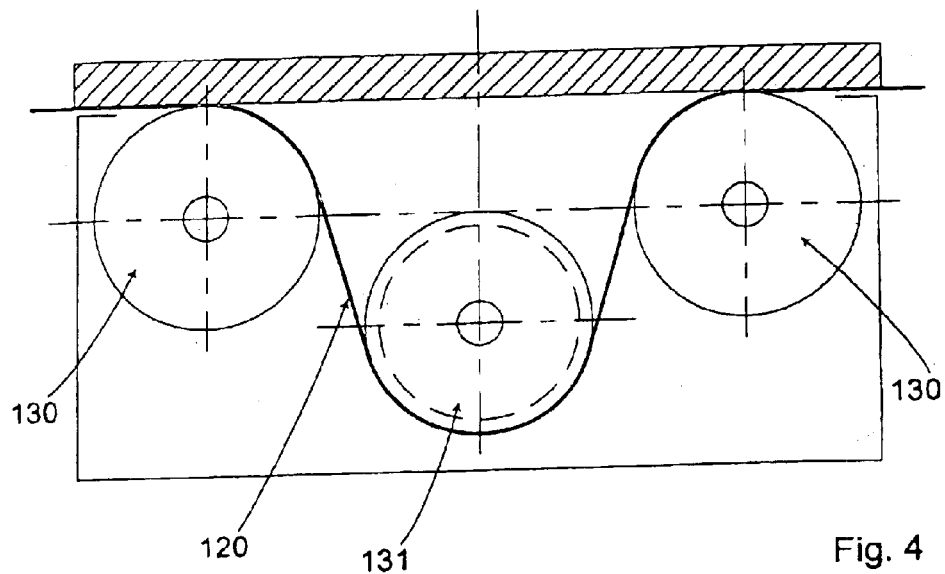
FIG. 4 depicts a longitudinal cross-sectional view of a linear seal of a second embodiment.
Figure 5:
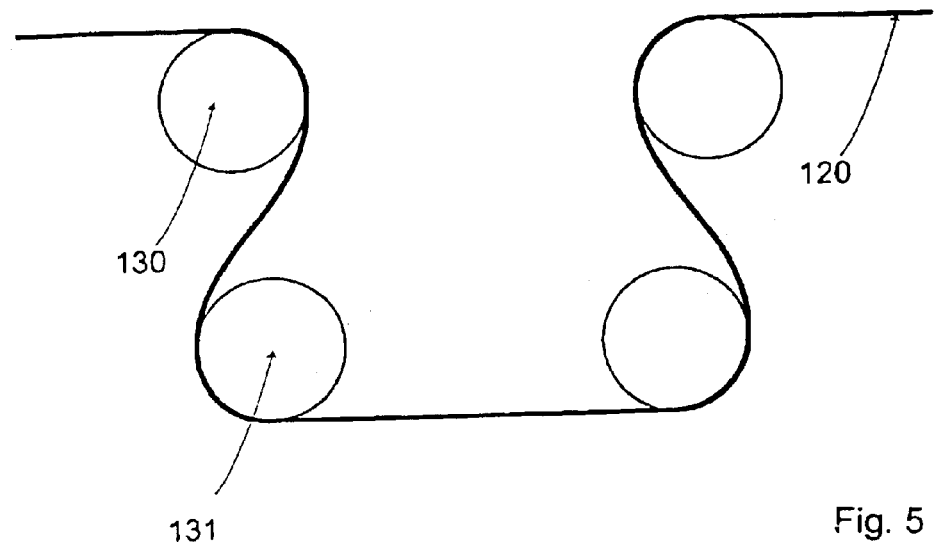
FIG. 5 depicts a longitudinal cross-sectional view of a linear seal of a third embodiment.

FIGS. 4 and 5 show the second and third embodiments, respectively, which are the same as the first embodiment except that one or two (or more) further rollers 131 are used to hold the elongate sealing member 120 away from the slot at the selectable portion 125. This is done by positioning the further rollers 131 on the opposite side of the elongate sealing member to the rollers 130 between the slot 112 and the elongate sealing member 120. The further rollers 131 are in rolling contact with the elongate sealing member 120.

Figure 6:
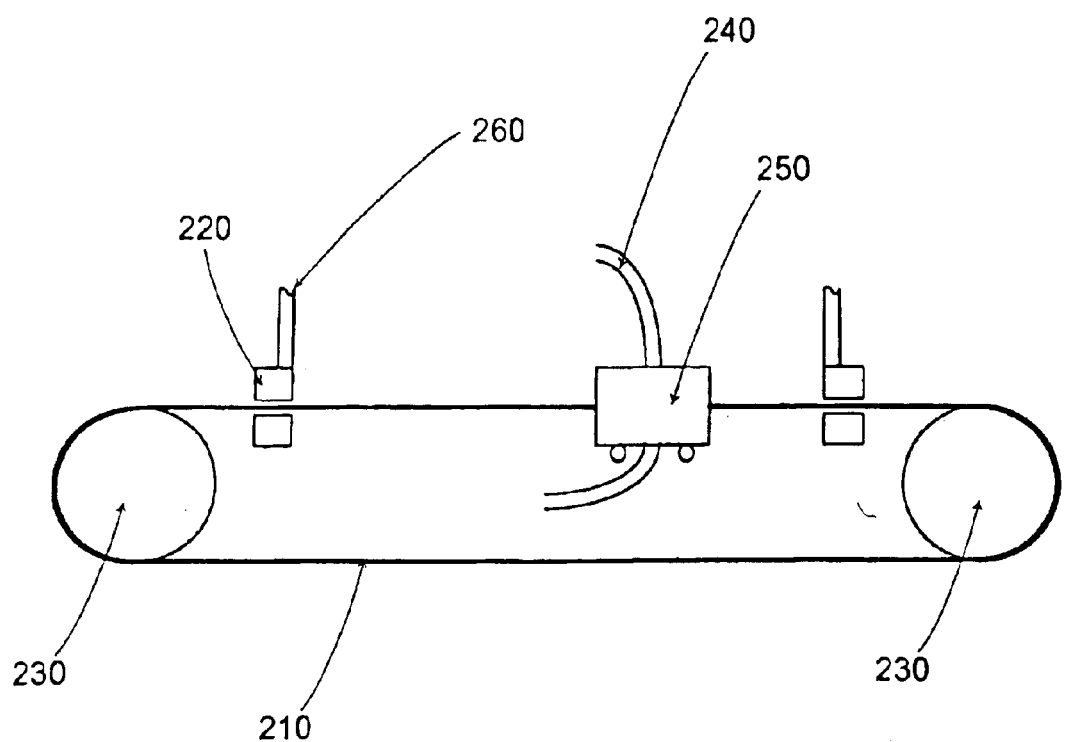
FIG. 6 depicts a longitudinal cross-sectional view of a linear seal of a fourth embodiment.

In a fourth embodiment illustrated in FIG. 6, an elongate sealing band 210 is used to seal the vacuum chamber VC. The band 210 is supported on and rotated by two rollers 230. A fixed length of band is always inside the vacuum chamber but the part of the band inside the vacuum chamber is altered by rotation of the band 210. A car 250 is attached between portions of the band 210 and is always situated on one side (top side as illustrated) in the vacuum chamber VC and on the other side (bottom side as illustrated) outside of the vacuum chamber VC. The car 250 allows the passage of conduits 240 through it from outside of the vacuum chamber VC to inside of the chamber. By rotation of the rollers 230 and thereby the band 210, the car 250 and thereby the entry point of the conduits into the vacuum chamber VC is varied in one degree of freedom. Seals 220 between side walls 260 of the vacuum chamber VC and the band 210 (which may be vacuum seals for example) seal all around the portion of band 210 in the chamber (i.e. along both longitudinal edges and across the width at the end of the portions). This system has low inertia and is mechanically relatively non-complex.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a beam of radiation;
   a support constructed and arranged to support a patterning device, the patterning device constructed and arranged to pattern the beam of radiation according to a desired pattern;
   a substrate table constructed and arranged to hold a substrate;
   a projection system constructed and arranged to project the patterned beam onto a target portion of the substrate;
   a vacuum chamber that encloses at least one of the support and the substrate table;
   an elongate through-slot in a wall of the vacuum chamber; and
   a linear seal constructed and arranged to seal the vacuum chamber along the slot, wherein the linear seal comprises:
   an elongate sealing member constructed and arranged to seal the vacuum chamber along the slot, the sealing member being locally displaceable at a selectable position to provide an opening into the vacuum chamber.

2. An apparatus according to claim 1, wherein the elongate sealing member is formed of a metallic material.

3. An apparatus according to claim 1, wherein the elongate sealing member is bent at the selectable position and substantially flat elsewhere.

4. An apparatus according to claim 1, further comprising a conduit constructed and arranged to provide utilities to at least one of the support structure and the substrate table in the vacuum chamber, the conduit passing through the slot and between the wall and the elongate sealing member at the selectable position.

5. An apparatus according to claim 1, wherein the linear seal further comprises two rollers one on either side of the selectable position and in rolling contact with the elongate sealing member, the selectable position being selectable by movement of the rollers together.

6. An apparatus according to claim 5, further comprising at least one further roller in rolling contact with the elongate sealing member positioned between the elongate sealing member and the slot at the selectable position.

7. An apparatus according to claim 1, wherein the elongate sealing member is comprised of a ferromagnetic material and magnets are positioned along the slot to attract the elongate sealing member towards the slot.

8. An apparatus according to claim 1, wherein the linear seal further comprises a further sealing member constructed and arranged to seal around the selectable position.

9. An apparatus according to claim 8, wherein the further sealing member comprises a housing positioned over the selectable position and constructed and arranged to seal against the wall and the elongate sealing member thereby to seal the slot at the selectable position.

10. A device manufacturing method, comprising:
projecting a patterned beam of radiation onto a target portion of a layer of radiation-sensitive material at least partially covering a substrate, at least one of a substrate and the patterning device configured to pattern the beam of radiation being disposed in a vacuum chamber having a wall with an elongate through-slot;
positioning the substrate or the patterning device in the vacuum chamber;
sealing the vacuum chamber along the through-slot using a linear seal, wherein the linear seal comprises an elongate sealing member constructed and arranged to seal the vacuum chamber along the through-slot; and
locally displacing the elongate sealing member at a selectable position to provide an opening into the vacuum chamber.

11. A device manufacturing according to the method of claim 10.

12. A lithographic projection apparatus, comprising:
a radiation system constructed and arranged to provide a beam of radiation;
a support constructed and arranged to support a patterning device, the patterning device constructed and arranged to pattern the beam of radiation according to a desired pattern;
a substrate table constructed and arranged to hold a substrate;
a projection system constructed and arranged to project the patterned beam onto a target portion of the substrate;
a vacuum chamber that encloses at least one of the support structure and the substrate table;
an elongate through-slot in a wall of the vacuum chamber; and
a linear seal constructed and arranged to seal the vacuum chamber along the through-slot, the linear seal comprising:
a rotatable sealing band constructed and arranged to seal against the through-slot.

* * * * *